United States Patent
Kamemura et al.

(10) Patent No.: US 6,952,025 B2
(45) Date of Patent: Oct. 4, 2005

(54) SEMICONDUCTOR LIGHT-EMITTING DEVICE

(75) Inventors: Takayuki Kamemura, Chichibu (JP); Kazuhiro Mitani, Chichibu (JP); Teruyuki Kobayashi, Chichibu (JP); Nobuo Uotani, Chiba (JP); Kasumi Nakamura, Chiba (JP); Yuji Itoh, Chiba (JP)

(73) Assignee: Showa Denko K.K., Tokyo (JP)

( * ) Notice: Subject to any disclaimer, the term of this patent is extended or adjusted under 35 U.S.C. 154(b) by 210 days.

(21) Appl. No.: 10/048,854

(22) PCT Filed: Jun. 5, 2001

(86) PCT No.: PCT/JP01/04725

§ 371 (c)(1),
(2), (4) Date: Feb. 6, 2002

(87) PCT Pub. No.: WO01/95402

PCT Pub. Date: Dec. 13, 2001

(65) Prior Publication Data

US 2002/0134986 A1 Sep. 26, 2002

Related U.S. Application Data

(60) Provisional application No. 60/267,423, filed on Feb. 9, 2001, provisional application No. 60/263,241, filed on Jan. 23, 2001, and provisional application No. 60/217,105, filed on Jul. 10, 2000.

(30) Foreign Application Priority Data

| Jun. 8, 2000 | (JP) | P2000-172489 |
| Jan. 15, 2001 | (JP) | P2001-006703 |
| Mar. 7, 2001 | (JP) | P2001-063785 |

(51) Int. Cl.$^7$ .......................... H01L 21/00; H01L 29/22; H01L 29/227

(52) U.S. Cl. .............................. 257/98; 257/99; 438/22; 438/25; 438/27

(58) Field of Search .................. 257/98, 99; 438/22, 438/25, 27

(56) References Cited

U.S. PATENT DOCUMENTS

| 5,137,844 A | | 8/1992 | Chiulli |
| 5,192,985 A | * | 3/1993 | Abe ............................. 257/13 |
| 5,422,194 A | * | 6/1995 | Satoh et al. ................. 428/704 |
| 5,498,498 A | * | 3/1996 | Uchikawa et al. ............. 430/7 |

(Continued)

FOREIGN PATENT DOCUMENTS

| DE | 197 57 850 | 7/1998 |
| EP | 0 404 565 | 12/1990 |
| FR | 2 273 438 | 12/1975 |
| JP | 7-38148 | 2/1995 |
| JP | 8-167733 | 6/1996 |

OTHER PUBLICATIONS

International Search Report for PCT/JP01/04725 dated Jan. 3, 2002.

Primary Examiner—Nathan J. Flynn
Assistant Examiner—Victor A. Mandala, Jr.
(74) Attorney, Agent, or Firm—Sughrue Mion, PLLC

(57) ABSTRACT

A small-sized semiconductor light-emitting device of high emission directivity and high output is provided. A portion of a light extraction section of a semiconductor light-emitting device including a pn-junction portion is covered with a light-shielding substance of low conductivity. The electrical resistance of the light-shielding substance is $10^6$ Ωm or higher, and the substance contains powder of at least one species selected from metals and pigments. The powder of metal contains at least one species selected from among Al, Cu, Ag, Au, Pt, Ti, Ni, Sn, Pb, Mg, Zn, Fe, Co, and Cr. The powder is a plate-like powder having a thickness falling within a range of 0.001–10 μm and a length falling within a range of 0.01–100 μm.

16 Claims, 4 Drawing Sheets

U.S. PATENT DOCUMENTS

| | | | |
|---|---|---|---|
| 5,591,988 A | * 1/1997 | Arai et al. | 257/59 |
| 5,686,980 A | 11/1997 | Hirayama et al. | |
| 5,691,101 A | * 11/1997 | Ushirogouchi et al. | 430/176 |
| 5,869,929 A | * 2/1999 | Eida et al. | 313/501 |
| 6,214,636 B1 | * 4/2001 | Sawayama et al. | 438/57 |
| 6,376,057 B1 | * 4/2002 | Akao et al. | 428/215 |
| 6,407,411 B1 | * 6/2002 | Wojnarowski et al. | 257/99 |
| 6,800,405 B2 | * 10/2004 | Kobayashi | 430/5 |
| 2002/0135720 A1 | * 9/2002 | Yamanaka et al. | 349/122 |

* cited by examiner

SEMICONDUCTOR LIGHT-EMITTING DEVICE

CROSS-REFERENCE TO RELATED APPLICATIONS

This application claims the benefit pursuant to 35 U.S.C. §119(e)(1) of U.S. Provisional Applications, No. 60/217,105 filed Jul. 10, 2000, No. 60/263,241 filed Jan. 23, 2001, and No. 60/267,423 filed Feb. 9, 2001.

TECHNICAL FIELD

The present invention relates to a semiconductor light-emitting device, and more particularly to a semiconductor light-emitting device exhibiting enhanced emission directivity.

BACKGROUND ART

Light-emitting diodes (hereinafter referred to as "LEDs") and laser diodes are known as light-emitting devices including semiconductors. For example, an LED including a Group III-V compound semiconductor is produced through epitaxial growth of a layer of GaP, GaAsP, GaAs, GaAlAs, GaAlInP, or GaN on a single-crystal substrate of GaP or GaAs. The LED includes pn-junction portions which are formed of one or more p-type layers and one or more n-type layers, and has an appropriate structure such that light is emitted when electrons are introduced into the pn-junction portions.

In an LED, light is emitted from a pn-junction portion in all directions. In contrast, a laser diode exhibits high emission directivity, and thus is used when light is required to be emitted in a specific direction. However, a laser diode involves disadvantages, in that it is expensive and requires high power for operation thereof, and thus LEDs exhibiting emission directivity have been proposed. For example, there has been proposed a current-constricting LED, which is formed by partial modification of a conventional LED and exhibits enhanced emission directivity. However, a current-constricting LED involves disadvantages, including difficulty in control of epitaxial growth of crystal and low reliability attributed to flow of high current to a portion of the crystal. In addition, although a current-constricting LED is less expensive than a laser diode, the LED has a complicated structure and is expensive as compared with a conventional LED.

In order to enhance emission directivity of a conventional LED, a reflection plate or a reflection cup is provided or formed on the frame of a light extraction section of the LED. However, when a reflection plate or a reflection cup is provided or formed, the resultant light-emitting apparatus may be expensive, and miniaturization of the apparatus is difficult, which is unsatisfactory. In addition, a light emission region cannot be formed as small as that of a laser diode or a current-constricting LED, and thus such a conventional LED is difficult to use as a point-source light.

In order to use such a conventional LED as a point-source light, there is proposed an LED including a window for light extraction on the upper electrode. However, light which leaks from the side of the LED becomes stray light, and thus noise increases and S/N ratio decreases. As a result, emission directivity of the LED is similar to that of a conventional LED.

DISCLOSURE OF INVENTION

In view of the foregoing, an object of the present invention is to provide a small-sized LED exhibiting high emission directivity and having high output; a process for producing the LED; a high-performance optical sensor or optical communication apparatus which includes the LED; and an electronic apparatus including the sensor or apparatus.

In order to solve the above-described problems, the present inventors have performed extensive studies, and have found that an LED exhibiting high emission directivity can be produced by covering the LED with a substance which has low conductivity and exhibits a light-shielding property. The present invention has been accomplished on the basis of this finding. Accordingly, the present invention provides:

(1) a semiconductor light-emitting device comprising a pn-junction portion, wherein a portion of the device is covered with a substance which exhibits a light-shielding property (hereinafter the substance will be referred to as a "light-shielding substance");

(2) a semiconductor light-emitting device according to (1), wherein the light-shielding substance comprises at least one species selected from among metals and pigments;

(3) a semiconductor light-emitting device according to (2), wherein the metal comprises at least one species selected from among Al, Cu, Ag, Au, Pt, Ti, Ni, Sn, Pb, Mg, Zn, Fe, Co, and Cr;

(4) a semiconductor light-emitting device according to (2) or (3), wherein the pigment comprises at least one species selected from among organic and inorganic pigments, such as extender pigments, white pigments, black pigments, yellow pigments, brown pigments, red pigments, purple pigments, blue pigments, green pigments, fluorescent pigments, and metallic powder pigments;

(5) a semiconductor light-emitting device according to any one of (1) through (4), wherein the light-shielding substance which covers a portion of the device has an electrical resistance of about $10^6$ ΩM or more;

(6) a semiconductor light-emitting device according to any one of (2) through (5), wherein the light-shielding substance comprises powder, and an electrically insulating layer is formed on the surface of the powder;

(7) a semiconductor light-emitting device according to any one of (2) through (6), wherein the light-shielding substance comprises powder, and the surface of the powder is covered with a resin having a thickness falling within a range of approximately 0.01–30 μm;

(8) a semiconductor light-emitting device according to (6) or (7), wherein the particle size of the powder falls within a range of approximately 0.01–100 μm;

(9) a semiconductor light-emitting device according to any one of (6) through (8), wherein the powder is a plate-like powder having a thickness falling within a range of approximately 0.001–10 μm and a length falling within a range of approximately 0.01–100 μm;

(10) a semiconductor light-emitting device according to any one of (1) through (9), wherein the light-shielding substance comprises a substance having a total reflectivity of 50% or more in an amount of 50 mass % or more;

(11) a semiconductor light-emitting device according to any one of (1) through (10), wherein the wavelength of emission of the device falls within a range of approximately 350–1,800 nm;

(12) a semiconductor light-emitting device according to any one of (1) through (11), wherein the light-shielding substance which covers a portion of the device has a transmittance of 50% or less with respect to the light emitted by the device;

(13) a semiconductor light-emitting device according to any one of (1) through (12), wherein the surface of a portion of the device which is covered with the light-shielding substance has an irregular portion;

(14) a semiconductor light-emitting device according to (13), wherein the depth of the irregular portion falls within a range of approximately 0.1–50 µm;

(15) a process for producing a semiconductor light-emitting device as recited in any one of (1) through (14), which process comprises forming grooves on a portion of an epitaxial wafer that is used for producing a semiconductor light-emitting device, the portion being intended to be covered with a light-shielding substance; covering the grooves with the light-shielding substance; and cutting the epitaxial wafer into individual semiconductor light-emitting devices;

(16) a process for producing a semiconductor light-emitting device according to (15), wherein the width of the grooves which are formed on a light extraction section falls within a range of 5–500 µm;

(17) a process for producing a semiconductor light-emitting device as recited in any one of (1) through (14), which process comprises arranging a plurality of semiconductor light-emitting devices on an adhesive sheet so as to form spaces between the devices; and applying a light-shielding substance to interdevice spaces to thereby cover the devices;

(18) a process according to (17), wherein the width of the interdevice spaces falls within a range of approximately 5–3,000 µm;

(19) a process for producing a semiconductor light-emitting device as recited in any one of (1) through (14), which process comprises masking a light extraction section of the device; covering the device with a light-shielding substance; and removing a substance used for masking of the light extraction section;

(20) a semiconductor light-emitting device which is produced through a process as recited in any one of (15) through (19);

(21) a resin-encapsulated light-emitting device which is produced from a semiconductor light-emitting device as recited in any one of (1) through (14) and (20);

(22) a resin-encapsulated light-emitting device according to (21), wherein a resin used for encapsulation transmits light emitted from a semiconductor light-emitting device, and comprises any single species selected from among epoxy resins, urea resins, and silicone resins;

(23) an optical sensor which is produced from a semiconductor light-emitting device as recited in any one of (1) through (14) and (20), or a resin-encapsulated light-emitting device as recited in (21) or (22);

(24) an optical communication apparatus or a display apparatus which is produced from a semiconductor light-emitting device as recited in any one of (1) through (14) and (20), or from a resin-encapsulated light-emitting device as recited in (21) or (22);

(25) an electronic apparatus comprising an optical sensor as recited in (23); and

(26) an electronic apparatus comprising an optical communication apparatus or a display apparatus as recited in (24).

BEST MODE FOR CARRYING OUT THE INVENTION

Figure 1:
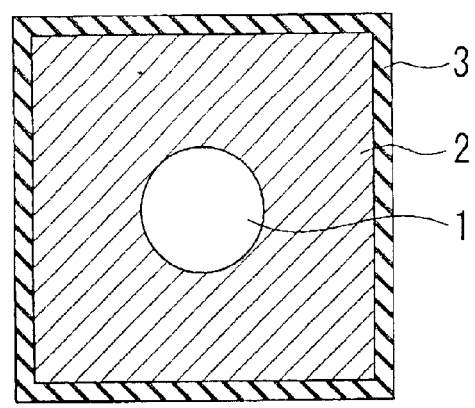
FIG. 1 is a plan view of the light extraction section of the semiconductor light-emitting device of the present invention.

The semiconductor light-emitting device of the present invention includes a pn-junction which is formed of p-type and n-type semiconductor layers, the layers being epitaxially grown on a single-crystal substrate. Specific examples of the semiconductor light-emitting device include semiconductor light-emitting devices formed from Group III-V elements such as GaP, GaAs, GaAlAs, GaAsP, GaN, and AlInGaP; and semiconductor light-emitting devices formed from Group II-VI elements such as ZnSe and ZnS. Examples of the structure of the semiconductor light-emitting device include a homo-junction structure, a single-hetero (hereinafter referred to as an "SH") structure, a double-hetero (hereinafter referred to as a "DH") structure, a transparent-substrate-including double-hetero (hereinafter referred to as a "TS-DH") structure, a single quantum well structure, and a multiple quantum well structure. An epitaxial layer of the semiconductor light-emitting device having such a structure is usually grown through liquid-phase epitaxy, but may be grown through vapor-phase epitaxy employing a halide, or through MOCVD or MBE employing an organometallic compound. Such an epitaxial layer may be used in the semiconductor light-emitting device of the present invention.

In the semiconductor light-emitting device of the present invention, a portion exclusive of a light extraction section is covered with a light-shielding substance. The term "light-shielding substance" refers to a substance which has a function for preventing irradiation to the outside of the device of light emitted by the light-emitting device. The light-shielding substance may have a function for absorption of emitted light or a function for reflection of emitted light so as to prevent irradiation to the outside of the device of light emitted by the light-emitting device. When the light-shielding substance is a substance having a function for reflection of emitted light, reflection light of the device is preferably irradiated to the outside of the device through a light extraction section. Consequently, the intensity of emitted light of high directivity can further be enhanced. The term "light extraction section" refers to a section from which light of high directivity is emitted, the section being at the top surface, the side surfaces, and the bottom surface of the semiconductor light-emitting device. The shape of the section (the shape of a light extraction surface) and the size of the section (the size of the light extraction surface) are not particularly limited, but the shape and size are preferably designed such that light is effectively extracted, in accordance with the use or purpose of the device, or the shape of a package of the device. The entirety of a portion exclusive of the light-extraction section is not necessarily covered with a light-shielding substance. For example, in the case in which an electrode that does not transmit emitted light is formed on the top surface of the device, when the side surfaces of the device are covered with a light-shielding substance, light of high directivity can be extracted through a portion of the top surface exclusive of the electrode. The electrode may assume any shape, such as circular, ellipsoid, square, rectangular, or polygonal. In order to decrease the size of a light extraction surface, an opening may be formed in the electrode, to thereby extract light through the opening. The opening may assume any shape, such as circular, ellipsoid, square, rectangular, or polygonal, and the size of the opening may be arbitrarily determined. The shape and size of the light extraction surface may be determined by provision of a plurality of electrodes.

A light-shielding substance used in the present invention includes a substance of low conductivity. This is because when the conductivity of the light-shielding substance is low, the substance can be applied directly to the surface of the semiconductor light-emitting device without the substance exerting any effect on electrical characteristics of the device. When the surface of the device is covered with a substance of low conductivity, surface leak current decreases, and thus the device has high reliability. The electric resistivity of a light-shielding substance is preferably $10^6$ Ωm or higher, more preferably $10^8$ Ωm or higher. Much more preferably, the substance is an insulator.

Figure 7:
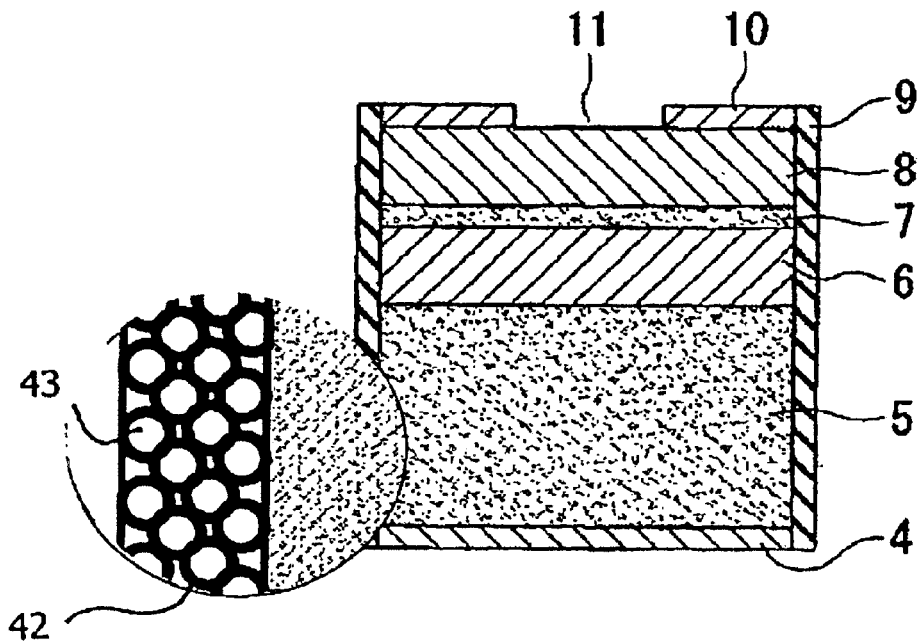
FIG. 7 is a cross-sectional view of the semiconductor light-emitting device including an enlarged view of a substrate coated with an insulating layer on the surface thereof covering the semiconductor light-emitting device. Although the substance is depicted as being spherical, the substance can be a variety of shapes and may not be coated with an insulating layer.

In the present invention, a substance which is used for covering the semiconductor light-emitting device preferably contains at least one species selected from metals and pigments. The substance may be powder containing a metal or a pigment. The substance 43 is shown in FIG. 7, and is depicted as having a spherical shape but is not limited thereto and may be a variety of shapes, such as plate-like, spherical or amorphous. The substance exhibits excellent light-shielding properties with respect to light emitted by the device. When the substance is powder, the device can be uniformly covered with the substance, because of high dispersibility of powder. When the substance is powder and is dissolved in a solvent and applied to the device, the substance exhibits high affinity to a binder.

The substance preferably includes at least one metal selected from among Al, Cu, Ag, Au, Pt, Ni, Sn, Pb, Mg, Zn, Fe, Co, and Cr, or an alloy such as Ni—Cu, Co—Ni, or Au—Ag. Alternatively, a non-metallic element or a semi-metallic element is preferably used. When powder of such a metal is used, the powder may be coated with an oxide of a metal which is the same species as or a different species from the metal of the powder; or the powder may be coated with a resin so as to form an insulating layer 42 on the surface of the powder, which is depicted, for example, in FIG. 7. Such an oxide or insulating layer is suitable for lowering the conductivity of the light-shielding substance.

Examples of the pigment include extender pigments, white pigments, black pigments, yellow pigments, brown pigments, red pigments, purple pigments, blue pigments, green pigments, and fluorescent pigments. These pigments may be employed singly or in combination of two or more species.

Specific examples of extender pigments include silica, alumina, talc, barite powder, and barium carbonate. Specific examples of white pigments include zinc flower, titanium oxide, zinc sulfide, and antimony oxide. Specific examples of black pigments include carbon black, acetylene black, and Aniline Black. Specific examples of yellow pigments include yellow lead, zinc yellow, and barium chromate. Specific examples of brown pigments include iron oxide, amber, Permanent Brown, and Para Brown. Specific examples of red pigments include red iron oxide, cadmium red, Permanent Red 4R, Para Red, and Fire Red. Specific examples of purple pigments include cobalt violet, manganese violet, Fast Violet B, and Methyl Violet Lake. Specific examples of blue pigments include ultramarine, Prussian blue, Alkali Blue Lake, and Phthalocyanine Blue. Specific examples of green pigments include Chrome Green, viridian, emerald green, and Phthalocyanine Green. Specific examples of fluorescent pigments include zinc sulfide, zinc silicate, zinc cadmium sulfide, and strontium sulfide. Pigments may be organic substances or inorganic substances, and are not limited to the aforementioned examples. Of these, a pigment of high electrical resistivity can be applied directly to the surface of the semiconductor light-emitting device without exerting any effect on electrical characteristics of the device. When pigment powder of low electrical resistivity is used, the powder may be coated with a resin so as to form an insulating layer on the surface of the powder. The thickness of such a resin layer formed on the surface of the powder preferably falls within a range of 0.01–30 μm.

The electrical resistivity of a light-shielding substance containing powder of Al, Ti, or Mg can be easily lowered, since such powder is susceptible to oxidation, and its surface is oxidized in air. Alumina, titanium oxide, or silica may be used, but generally, such an oxide has low reflectivity as compared with a metal. Therefore, when a light-shielding substance containing such an oxide is used, in order to enhance the effect of reflection, a large amount of the substance is applied onto the device so as to increase reflectivity, or another substance which has high reflectivity is applied to the surface of the device before application of the light-shielding substance.

Metallic powder may assume any of a variety of shapes, such as plate-like, spherical, or amorphous. The particle size of metallic powder is preferably 0.01–100 μm, more preferably, 0.1–80 μm, much more preferably 1–50 μm. When the particle size is less than 0.01 μm, a light-shielding substance exhibits insufficient light-shielding properties, whereas when the particle size is in excess of 100 μm, adhesion of the substance to the semiconductor light-emitting device decreases.

Metallic powder preferably assumes a plate-like shape. The results of tests performed by the present inventors show that thin plate-like powder exerts excellent effects, the powder having a thickness of 0.001–10 μm, preferably 0.001–0.5 μm, and a length of 0.01–100 μm, preferably 1–50 μm. When plate-like powder is applied to the device and a solvent is evaporated, the powder is arranged so as to be parallel to the application surface, due to surface tension of the solvent. As a result, a mirror-like film of high reflectivity is formed on the device. Even when the resultant film is thin, the device is reliably covered with the film. When plate-like powder having a thickness of less than 0.001 μm is used and a light-shielding substance containing the powder is applied to the device, films of the substance are deformed, and the films are laminated so as to form an uneven plane. Consequently, reflectivity of light decreases.

In the present invention, in order to cover the semiconductor light-emitting device with a light-shielding substance containing a metal, a pigment, or powder thereof, the device may be directly covered with the substance through chemical deposition, physical deposition, or application. Alternatively, the substance may be mixed with a resin serving as a binder, the resultant mixture dispersed in water or an organic solvent, and the resultant dispersion applied onto the surface of the device, and then dried and cured.

No particular limitation is imposed on the type of a resin serving as a binder, so long as the resin barely absorbs light emitted by the semiconductor light-emitting device, a light-shielding substance is highly dispersible in the resin, and the resin is soluble in water or an organic solvent; and a film is formed after application and drying of the resin, or a film is formed through curing by means of light or heat after application and drying of the resin. Examples of such a resin include hydrocarbon resins, acrylic acid resins, vinyl acetate and vinyl alcohol resins, halogen-containing resins, nitroqen-containing vinyl polymers, phenol resins, amino resins, aromatic hydrocarbon resins, polyester resins, polyamide resins, silicon resins, polyurethane resins, epoxy resins, and protein resins. Examples of curable resins which cause cross-linking reaction after application include UV curable resins and thermosetting resins. These resins may be used singly or in combination of two or more species.

Examples of a solvent used for dispersion of a light-shielding substance include water, methanol, ethanol, isopropanol, n-propanol, n-butanol, methyl ethyl ketone, ethyl acetate, butyl acetate, acetone, dimethylformaldehyde, methyl cellosolve, ethylene glycol, propylene glycol, a fluorine-containing solvent, toluene, and xylene. These solvents may be used singly or in combination of two or more species.

In the present invention, metallic powders and pigment powders may be incorporated into a light-shielding substance singly or in combination of two or more species. The amount of the powder as reduced to dry powder is preferably 5–99 mass % on the basis of the entire solid content of the light-shielding substance, more preferably 20–95 mass %, much more preferably 40–95 mass %. When the amount is less than 5 mass %, the light-shielding substance may exhibit unsatisfactory light-shielding properties, whereas when the amount is in excess of 99 mass %, adhesion of the substance to the light-emitting device decreases.

In the present invention, if necessary, a coating material for a light-shielding substance may further contain a variety of additives such as UV-absorbing agents, antioxidants, dispersants, fluorescent whitening agents, antifoaming agents, lubricants, and preservatives.

Specific examples of UV-absorbing agents include benzotriazole UV absorbing agents, triazine UV absorbing agents, and benzophenone UV absorbing agents, such as TINUVIN 234, TINUVIN 320, TINUVIN 1577, and CHIMASSORB 81 (products of Ciba Specialty Chemicals K.K.). The amount of a UV-absorbing agent which is incorporated into a light-shielding substance is preferably 0.01–10 mass %. Specific examples of antioxidants include phenol antioxidants, phosphite antioxidants, and thioether antioxidants, such as ADK Stab AO-20, AO-30, PEP-4C, PEP-8, AO-23, and AO-412S (products of Asahi Denka Kogyo K.K.). The amount of an antioxidant which is incorporated into a light-shielding substance is preferably 0.01–10 mass %. Specific examples of dispersants include Demol EP, Poiz 520, Poiz 521, and Poiz 530 (products of Kao Corporation). The amount of a dispersant which is incorporated into a light-shielding substance is preferably 0.01–10 mass %. Specific examples of fluorescent whitening agents include UVITEX OB and UVITEX OB-P (products of Ciba Specialty Chemicals K.K.). The amount of a fluorescent whitening agent which is incorporated into a light-shielding substance is preferably 0.01–10 mass %. Specific examples of antifoaming agents include EMULGEN 404 and Emasol O-15R (products of Kao Corporation). The amount of an antifoaming agent which is incorporated into a light-shielding substance is preferably 0.01–10 mass %. Specific examples of lubricants include Lunac S-30, Lunac S-40, Fatty Amide S, and Excel T-95 (products of Kao Corporation). The amount of a lubricant which is incorporated into a light-shielding substance is preferably 0.01–10 mass %. Specific examples of preservatives include Bioden-S, Bioden-421, and Amolden ALK (products of Daiwa Chemical Industries Ltd.). The amount of a preservative which is incorporated into a light-shielding substance is preferably 0.01–10 mass %. Additives which may be incorporated into a light-shielding substance are not limited to the aforementioned examples.

When the thickness of a light-shielding substance is very small, the substance may fail to shield emission satisfactorily, and thus the light-emitting device may exhibit unsatisfactory emission directivity, which is not preferable. In contrast, when the thickness of a light-shielding substance is very large, the resultant film on the device may become brittle, and thus adhesion between the film and the device may be unsatisfactory, which is not preferable. The thickness of a light-shielding substance is preferably 0.1–100 $\mu$m, more preferably 1–50 $\mu$m. A light-shielding substance may be applied to the light-emitting device two or more times. Alternatively, a plurality of light-shielding substances containing different ingredients may be alternately applied to the device two or more times, and in this case, the overall thickness of the substance may be regarded as the thickness of a light-shielding substance.

Figure 8:
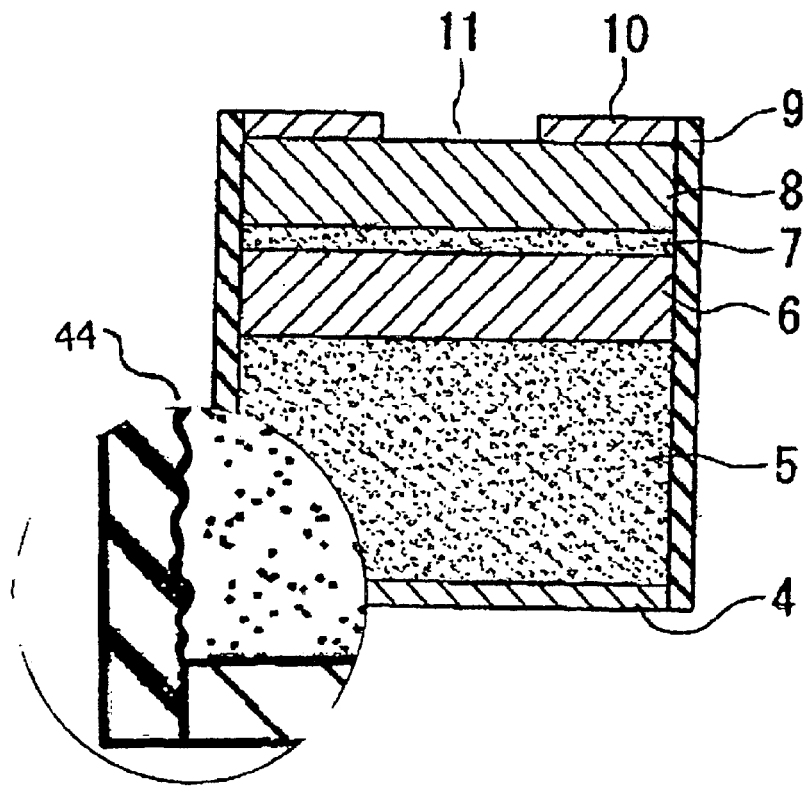
FIG. 8 is a cross-sectional view of the semiconductor light-emitting device including an enlarged view of the irregular portion formed on the crystalline surface of the semiconductor light-emitting device. The depth or the size of the irregular portion varies depending on the size of the light-shielding ingredient in the light-shielding substance or viscosity of a coating material in the substance.

An irregular portion 44 is preferably formed on the crystalline surface of the semiconductor light-emitting device in advance, which surface is intended to be covered with a light-shielding substance (see, e.g., FIG. 8). The irregular portion promotes uniform spread of a coating material contained in the substance over the crystalline surface, and also enhances adhesion between the substance and the device. The depth of the irregular portion may be appropriately determined in accordance with the size of a light-shielding ingredient in the light-shielding substance or the viscosity of a coating material in the substance. When the aforementioned light-shielding substance is employed, the depth is preferably 0.1–50 $\mu$m, more preferably 0.1–30 $\mu$m, much more preferably 0.1–15 $\mu$m.

In the present invention, in order to cover a portion of a light extraction section with a light-shielding substance effectively and uniformly at high reproducibility, one of the following processes, for example, may be carried out: a process in which grooves are formed on a portion exclusive of a light extraction section of an epitaxial wafer that is used for producing a semiconductor light-emitting device, the portion being intended to be covered with a light-shielding substance, the grooves are covered with the light-shielding substance, the substance is dried and cured, and the wafer is cut into individual semiconductor light-emitting devices; and a process in which a plurality of semiconductor light-emitting devices are arranged on an adhesive sheet so as to form spaces between the devices, and a light-shielding substance is applied to interdevice spaces, to thereby cover the side surfaces of the devices. In the latter process, in order to obtain emitted light of high directivity, a relatively large amount of the substance is applied to the interdevice spaces such that a portion of the substance overflows the spaces, a portion of a light extraction section of the device is covered with the substance, the substance is dried and cured, and the devices are separated individually. When a light-shielding substance is applied to the light-emitting device, in order to prevent covering of a light extraction surface and an electrode with the substance, the extraction surface and the electrode may be coated, in advance, with an organic protective material such as a resist or an adhesive tape, or with an inorganic protective material such as an $SiO_2$ film or an $Si_3N_4$ film, and such a protective material is removed after application of the substance.

A light-shielding substance may be applied through spin-coating, dip-coating, potting, flow-coating, or spraying. Application of the substance may be carried out several times, and in this case, different compositional coating materials may be used. The substance may be dried through a customary film drying method such as heat drying or vacuum drying.

When a coating material is applied to semiconductor light-emitting devices, the width of an interdevice space may be appropriately determined in consideration of the desired thickness of a light-shielding substance and the viscosity of the coating material. However, when the width of the space is less than 5 μm, the coating material encounters difficulty in entering the space, and thus the material may fail to be applied uniformly. In the case in which a light-shielding substance is applied to a wafer after formation of grooves on the wafer, the greater the width of the groove, the higher the ratio of a portion to which the substance is applied in a light-emitting device. However, the effect of the substance on shielding light is no longer changed commensurate with the high ratio of the portion. Therefore, the width of the groove is preferably 5–500 μm.

In the case in which semiconductor light-emitting devices are arranged so as to form spaces between the devices and a light-shielding substance is applied to the interdevice spaces, even when the spaces are made wider, the effect of the thickness of the substance is no longer changed commensurate with the wider spaces. Therefore, the width of the interdevice spaces is preferably 5–3,000 μm.

The aforementioned production process will be described in more detail. An electrode is formed on an epitaxial wafer that is to be used for producing a semiconductor light-emitting device, and if necessary, a portion of the wafer to which a light-shielding substance is not intended to be applied is subjected to masking. Grooves to which a light-shielding substance is applied may be formed through a mesa etching method in which the wafer is subjected to photolithography, or a dicing method in which grooves are formed in the wafer by use of a dicing saw. Each groove must have a sufficient width such that a coating solution can be applied to thereby form a film having a thickness required for light reflection, and a sufficient depth for obtaining an effective reflection function. The width of each groove must be greater than the thickness of a coating film. When the width of the groove is small, production costs are reduced since the size of a die can reduced, but application of the coating solution becomes difficult. Therefore, in general, the width of the groove is preferably 5–500 μm, more preferably 10–300 μm, much more preferably 20–180 μm. As used herein, the term "the width of the groove" refers to the width of the widest portion of the groove.

The depth of the groove must be determined in accordance with the thickness of the epitaxial layer, since an effective depth varies with the structure of the epitaxial wafer. In the case of a GaAlAs semiconductor light-emitting device including a GaAs substrate (emission wavelength: 880 nm or less), since radiation light is absorbed by the GaAs substrate, grooves are not necessarily formed in the substrate deeply, so long as an epitaxial layer is covered with a light-shielding substance.

A light-shielding substance may be applied through a technique such as spin-coating or spraying. When the substance is applied through such a technique, a film is formed more uniformly as compared with the case in which a coating solution is applied to the grooves. However, the light-shielding substance may be dispersed in the coating solution, and thus the formulation of the solution during application of the substance or application conditions must be considered carefully.

In order to enhance the penetrability of a resin serving as a binder to the grooves, the viscosity of the resin may be lowered by use of a solvent, or a small amount of a surfactant may be added to the resin to thereby improve wettability to a material. When irregularities are formed at the side of the groove through etching or mechanical polishing, the penetrability of the binder may be enhanced by means of a capillary phenomenon. Subsequently, the wafer is cut by a dicing saw at the grooves, to thereby form individual semiconductor light-emitting devices. Alternatively, the back side of the wafer may be scribed along the grooves by use of a scriber, to thereby form individual semiconductor light-emitting devices.

In the case of a GaP or GaN semiconductor light-emitting device in which radiation light is not absorbed in a substrate, when individual devices are formed by means of a dicing method or a scribing method, and then a light-shielding substance is applied to each device, leakage of light from the side surfaces of the device can be prevented, which is preferable. In this case, if necessary, an electrode section or a light extraction section to which a light-shielding substance is not intended to be applied may be subjected to masking in advance, and then application of the substance may be carried out.

When a light-shielding substance is applied by means of a capillary phenomenon, semiconductor light-emitting devices are arranged at regular intervals, and the substance is applied to the interdevice spaces, to thereby apply to the side surfaces of the devices. This procedure is preferable, since it is convenient. In this case, the manner of application of the solution varies with the width of the interdevice spaces. For example, when the spaces are narrow, the solution is easily applied by means of a capillary phenomenon, but the viscosity of the solution must be lowered. In contrast, when the spaces are wide with respect to the viscosity of the solution, the solution fails to penetrate and coating is not carried out efficiently. The studies performed by the present inventors show that, when the width of the spaces is 500 μm or less, the viscosity of the solution must be lowered to 50 cp or less. When application is to be carried out by means of a capillary phenomenon, semiconductor light-emitting devices are affixed on an adhesive sheet. The adhesive sheet may be an adhesive-layer-containing polyethylene sheet, vinyl chloride sheet, or acrylic sheet. When the width of the spaces is 5 μm or more, application can be carried out. However, when the spaces are very wide, application cannot be carried out, since a capillary phenomenon does not occur satisfactorily. Therefore, the width of the interdevice spaces is preferably 5–3,000 μm, more preferably 10–1,000 μm, much more preferably 50–300 μm. When an adhesive sheet is used, a solvent which does not dissolve the sheet must be chosen.

A light-shielding substance may be applied through spin-coating. In this case, since the substance is applied by means of centrifugation, a substance having a relatively high viscosity can be used for application, and the thickness of the resultant film becomes uniform. However, when a light-shielding substance to be dispersed differs from a binder solution in specific gravity, the substance and the solution are separated from each other, and the substance fails to be dispersed in the solution uniformly, and thus the formulation of the solution must be considered carefully. When spin-coating is carried out, the width of the interdevice spaces is preferably 5 μm or more regardless of the viscosity of the solution. The upper limit of the width of the spaces is not particularly limited. However, when the spaces are wide, the number of the devices which are treated in a single run of application is reduced, and thus productivity decreases.

A light-shielding substance may be applied through spraying. Spraying enables uniform application of the substance, but the resultant coating film tends to become thick. When formation of a thick film is intended, spraying is advantageously carried out.

Figure 9:
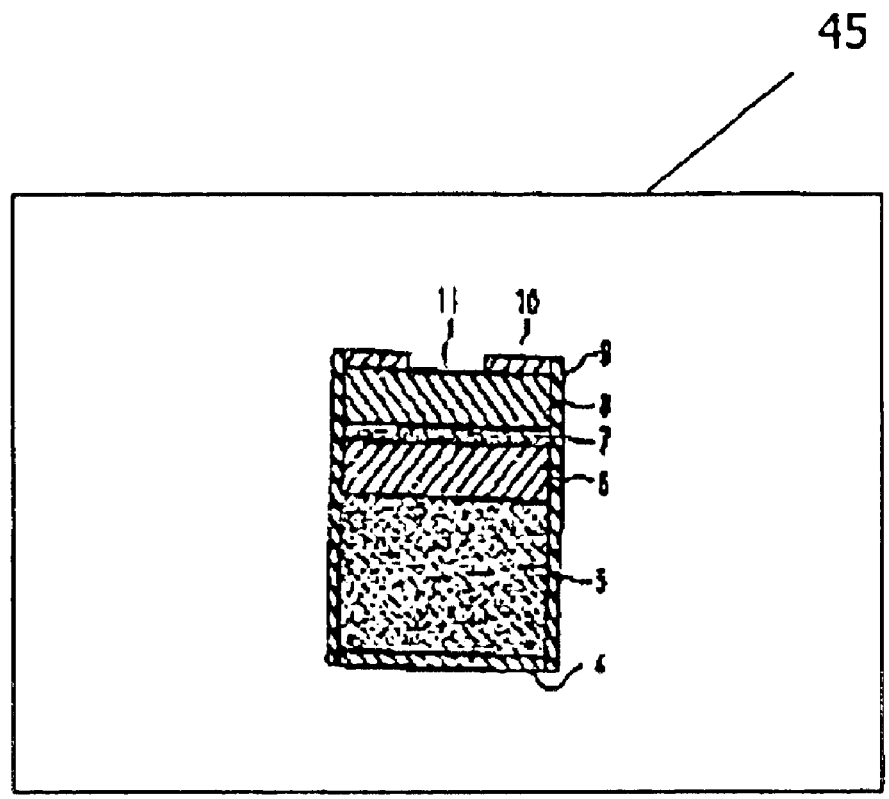
FIG. 9 is a cross-sectional view of the semiconductor light-emitting device encapsulated in a resin.

Like a conventional semiconductor light-emitting device, the semiconductor light-emitting device of the present invention may be encapsulated with a resin 45 (see, e.g., FIG. 9). A resin used for encapsulation preferably contains any one species selected from among epoxy resins, urea resins, and silicone resins, which resins transmit light emitted from the semiconductor light-emitting device. A light-shielding function may be imparted to the resin used for encapsulation (encapsulation resin). In this case, the encapsulation resin may be mixed with a light-shielding substance, but application of the substance to a light extraction section is prevented. The amount of the substance applied to the light extraction section may be reduced.

The semiconductor light-emitting device of the present invention exhibits high emission directivity; enables reduction in the diameter of a light extraction section; has a small size and high reliability; and exhibits high emission output. Therefore, the device can be used in the form of a conventional semiconductor light-emitting device or a resin-encapsulated semiconductor light-emitting device. The semiconductor light-emitting device is suitably used in fields in which a laser diode or a current-constricting semiconductor light-emitting device is used, in addition to fields in which a conventional semiconductor light-emitting device is used. In addition, particularly, the device is suitably used in a variety of optical sensors which are mainly used for detecting the displacement or the position of a body, or is used as a light extraction section of an optical communication apparatus, such as a light source for IR-ray communication or optical fiber.

The semiconductor light-emitting device of the present invention has advantages in emission directivity, high emission output, high reliability, and low production cost, which advantages cannot be obtained in a conventional semiconductor light-emitting device, a laser diode, or a current-constricting semiconductor light-emitting device. Therefore, when the semiconductor light-emitting device is used in an apparatus, the apparatus can attain high reliability, low production cost, miniaturization, and power savings.

EXAMPLES

The present invention will next be described in more detail by way of Examples, which should not be construed as limiting the invention thereto.

Examples 1 Through 10

The semiconductor light-emitting device of the present invention was produced by use of an epitaxial wafer for producing a visible-light-emitting device (emission wavelength: 660 nm). The epitaxial wafer was produced as follows. On a p-type GaAs substrate, a p-type $Ga_{1-x1}Al_{x1}As$ ($0.5<x1<0.8$) transparent substrate layer, a p-type $Ga_{1-x2}Al_{x2}As$ ($0.5<x2<0.8$) cladding layer, a p-type $Ga_{1-x3}Al_{x3}As$ ($x3=0.35$) active layer, and an n-type $Ga_{1-x4}Al_{x4}As$ ($0.5<x4<0.8$) cladding layer were epitaxially grown in a successive manner, and then the p-type GaAs substrate was removed. The wafer had a double-hetero structure, a length of 45 mm, and a thickness of 180 μm.

The p-type transparent substrate layer and the n-type layer of the wafer were subjected to deposition and alloying of an Au alloy, to thereby form ohmic electrodes. On the electrode which was formed on the n-type layer, openings of 120 μmφ were formed at an interval of 350 μm through photolithography. The wafer was separated into devices through dicing such that each device had a square size of 350 μm×350 μm and the opening on the electrode formed on the n-type layer was positioned at the center of each device. The resultant devices were subjected to etching by use of ammonia-hydrogen peroxide, to thereby produce a number of semiconductor light-emitting devices having a size of 330 μm×330 μm×180 μm. The side of each LED device was measured by use of a surface roughness meter, and the depth of an irregular portion was found to be 5–8 μm.

Figure 2:
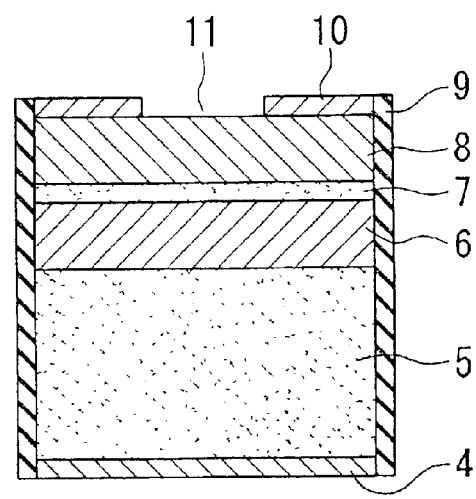
FIG. 2 is a cross-sectional view of the semiconductor light-emitting device of the present invention.

Subsequently, the thus-produced semiconductor light-emitting devices were arranged on an adhesive sheet in a lattice pattern and at an interdevice spacing of 200 μm. In each example, one of the light-shielding substances shown in Table 1 was applied to the side of the device through spin-coating, such that the substance was not applied to the electrode formed on the p-type substrate layer. In each of the substances, an acrylic resin and methanol were used as a binder and a solvent, respectively. The light-shielding substance was cured through drying at 40° C. for five hours. FIG. 1 is a schematic representation showing the light extraction section of the thus-produced semiconductor light-emitting device, and FIG. 2 shows a cross-sectional view of the light-emitting device. In these figures, reference numeral 1 indicates light extraction section, reference numeral 2 indicates Au electrode, reference numeral 3 indicates light-shielding substance, reference numeral 4 indicates Au electrode, reference numeral 5 indicates p-type GaAlAs transparent substrate layer, reference numeral 6 indicates p-type GaAlAs cladding layer, reference numeral 7 indicates p-type GaAlAs active layer, reference numeral 8 indicates n-type GaAlAs cladding layer, reference numeral 9 indicates light-shielding substance, reference numeral 10 indicates Au electrode, and reference numeral 11 indicates light extraction section Table 1 shows the results of evaluation of the semiconductor light-emitting devices of the Examples. In Table 1, "transmittance" refers to the transmittance of a light-shielding substance after the device has been covered with the light-shielding substance, and "electrical resistance" refers to the electrical resistance of a light-shielding substance after the device has been covered with the light-shielding substance.

TABLE 1

| No. | Light-shielding substance | Particle size (μm) | Thickness (μm) | Emission intensity (a.u.) Top surface (light extraction direction) | Emission intensity (a.u.) Side surface | Transmittance (%) | Electrical resistance (Ωm) |
|---|---|---|---|---|---|---|---|
| Ex. 1 | Al (coated with Epoxy resin) | 20 | 30 | 0.98 | 0.27 | 40 | $3 \times 10^8$ |
| Ex. 2 | Al (thickness: 0.2 μm, flat shape, surface oxidized) | 30 | 5 | 1.00 | 0.03 | 9 | $2 \times 10^7$ |
| Ex. 3 | Al (Al of Ex. 2, application: twice) | 30 | 10 | 1.01 | 0.00 | 0 | $2 \times 10^7$ |
| Ex. 4 | Ag (coated with epoxy resin) | 8 | 20 | 1.01 | 0.13 | 22 | $8 \times 10^8$ |
| Ex. 5 | Fe (surface oxidized) | 20 | 35 | 0.95 | 0.22 | 27 | $7 \times 10^6$ |
| Ex. 6 | Titanium oxide | 5 | 15 | 1.05 | 0.25 | 35 | $2 \times 10^{10}$ |
| Ex. 7 | Aniline Black | 2 | 8 | 0.94 | 0.18 | 21 | $5 \times 10^9$ |
| Ex. 8 | Barium chromate | 5 | 20 | 0.99 | 0.24 | 28 | $1 \times 10^9$ |
| Ex. 9 | Al (coated with epoxy resin) + Aniline Black | 20 2 | 35 | 0.97 | 0.20 | 24 | $4 \times 10^8$ |
| Ex. 10 | Titanium oxide + Al (application of Al of Ex. 2 on TiO$_2$ of Ex. 6) | 5 30 | 15+5 | 1.06 | 0.02 | 6 | $6 \times 10^8$ |
| Ex. 11 | Al foil | 1–30 | 2 | 0.89 | 0.01 | 2 | $2 \times 10^8$ |
| Ex. 12 | Al foil | 1–30 | 2 | 1.07 | 0.02 | 2 | $2 \times 10^8$ |
| Ex. 13 | Al foil | 1–30 | 2 | 2.53 | 0.00 | 0 | $2 \times 10^8$ |
| Comp. Ex. 1 | — | — | — | 1.00 | 1.00 | — | — |
| Comp. Ex. 2 | — | — | — | 0.82 | 0.51 | — | — |
| Comp. Ex. 3 | — | — | — | 1.00 | 1.00 | — | — |
| Comp. Ex. 4 | — | — | — | 2.16 | 1.98 | — | — |
| Comp. Ex. 5 | — | — | — | 2.52 | 1.22 | — | — |

Comparative Example 1

The semiconductor light-emitting device of Example 1 was evaluated without application of a light-shielding substance to the side surfaces of the device. The results are shown in Table 1.

As is apparent from Table 1, in the semiconductor light-emitting device of the present invention which is covered with a light-shielding substance, emission from the side surfaces is shielded, and light is emitted from only the top surface; i.e., emission directivity is high. In the devices of Examples 3, 4, 6, and 10, the intensity of emission from the top surface is enhanced, as compared with the device of Comparative Example 1, which is not covered with a light-shielding substance. In the devices of these Examples, emission output from the top surface is enhanced due to reflection from the light-shielding substance.

Example 11

Figure 3:
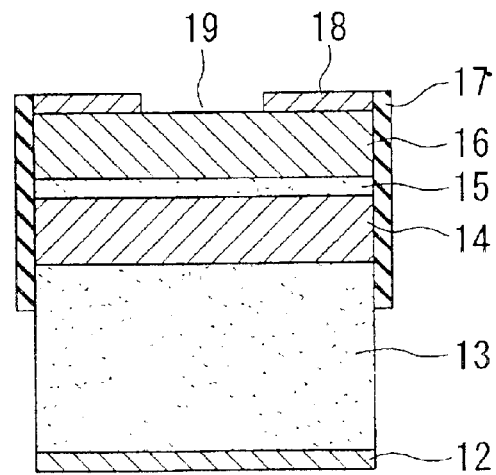
FIG. 3 is a cross-sectional view of the semiconductor light-emitting device of Example 11.

FIG. 3 shows a cross-sectional view of the semiconductor light-emitting device produced in Example 11. An epitaxial wafer for the semiconductor light-emitting device was produced as follows. On a Zn-doped p-type GaAs single-crystal substrate 13 (thickness: 250 μm), through a liquid epitaxial method, a Zn-doped p-type GaAlAs cladding layer 14 (thickness: 20 μm), a Zn-doped GaAlAs active layer 15 (thickness: about 1 μm), and a Te-doped n-type GaAlAs cladding layer 16 (thickness: 30 μm) were grown successively. In the active layer, the proportions of Ga, Al, and As were regulated to 0.65:0.35:1, so as to attain an emission wavelength of 660 nm. In the p-type cladding layer 14 and the n-type cladding layer 16, the proportions of Ga, Al, and As were regulated to 0.35:0.65:1, so as to transmit light of 660 nm. In the semiconductor light-emitting device produced from the wafer, the GaAs substrate 13 absorbs light of 660 nm, and thus light is not emitted from the surface of the substrate, and light is emitted only from the surface of the GaAlAs layer grown on the substrate. The substrate side of the wafer including the epitaxial layers was subjected to polishing, so as to attain a thickness of 240 μm.

A p-type ohmic electrode 12 was formed from an AuBe alloy, and an n-type ohmic electrode 18 was formed from an AuGeNi alloy. The electrode 12 was formed so as to cover the entirety of the GaAs substrate. An opening of 150 μmφ was formed in the electrode 18 provided on the n-type cladding layer 16. The opening served as a window for light extraction (light extraction section 19). A masking film was formed in advance on the electrodes and the window portion by use of a resist solution. Subsequently, by use of a dicing saw, grooves having a pitch of 400 μm, a width of 80 μm, and a depth of 100 μm were formed on the wafer in lateral and longitudinal directions. Thereafter, a solution containing Al foil chips in an amount of about 50% and a resin in an amount of 50%, which solution was diluted to ⅕ with a solvent, was applied to the grooves. The Al foil chip had a thickness of 0.02 μm and an average size of 10 μm, the size falling within a range of about 1–30 μm. The resultant wafer was subjected to heat treatment at 50° C. for 60 minutes so as to evaporate the solvent, to thereby form a light-shielding film 17. The amount of the solution for application was determined so as to attain a film thickness of about 10 μm during application. After drying, the thickness of the film was about 2 μm. Thereafter, the resist used for masking was removed, and the wafer was scribed on the back side along the grooves by use of a scriber, and then the wafer was separated, by use of a chip breaker, into individual semiconductor light-emitting devices.

In the light-shielding film, the Al foil chips were horizontally arranged such that each chip adhered to the surface of the device. The total reflectivity of the film was 90%, and the regular reflectivity (the ratio of the intensity of light reflected at 90° with respect the film to that of light applied at 90° with respect to the film) was 80%. The resultant semiconductor light-emitting device was mounted on a flat TO-18 stem containing no light reflection cup, and the emission directivity of the device was measured through application of a forward current of 20 mA. Consequently, the semiconductor light-emitting device exhibited ideal emission directivity; i.e., light is emitted only through the light extraction section. The evaluation results are shown in Table 1. The device was subjected to measurement of total luminous energy by use of an integrating-sphere photometer, and the emission output of the device was found to be 1.1 mW.

Comparative Example 2

Figure 4:
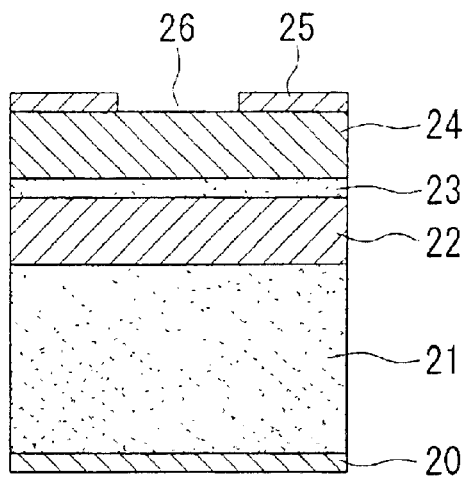
FIG. 4 is a cross-sectional view of the semiconductor light-emitting device of Comparative Example 2.

FIG. 4 shows a cross-sectional view of the semiconductor light-emitting device produced in Comparative Example 2. In this figure, reference numeral 20 indicates AuBe alloy electrode, reference numeral 21 indicates p-type GaAs single-crystal substrate, reference numeral 22 indicates p-type GaAlAs cladding layer, reference numeral 23 indicates GaAlAs active layer, reference numeral 24 indicates n-type GaAlAs cladding layer, reference numeral 25 indicates AuGeNi alloy electrode, reference numeral 26 indicates light extraction section. A light reflection film was not formed on the wafer prepared in Example 11, and by use of a scriber the wafer was separated into individual semiconductor light-emitting devices having a pitch of 400 μm. The emission directivity of the resultant device was measured in a manner similar to that of Example 11. Consequently, the emission directivity of the device was poor, because of leakage of light from the side surfaces of the device. The evaluation results are shown in Table 1. The device was subjected to measurement of total luminous energy by use of an integrating-sphere photometer, and the emission output of the device was found to be 1.3 mW. The device of Comparative Example 2 was poor in emission directivity as compared with the device of Example 11; i.e., utility of the present invention was verified.

Example 12

Figure 5:
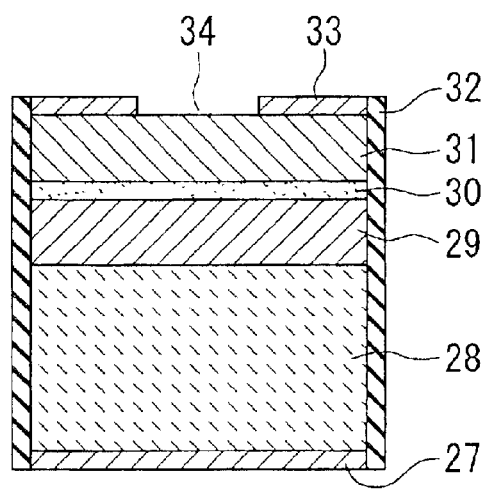
FIG. 5 is a cross-sectional view of the semiconductor light-emitting device of Example 12.

FIG. 5 shows a cross-sectional view of the semiconductor light-emitting device produced in Example 12. In this Example, an epitaxial wafer was produced as follows. On a Zn-doped p-type GaAs single-crystal substrate (thickness: 250 μm), through a liquid epitaxial method, a Zn-doped p-type GaAlAs transparent substrate layer 28 (thickness: 100 μm), a Zn-doped GaAlAs p-type cladding layer 29 (thickness: 20 μm), a Zn-doped GaAlAs active layer 30 (thickness: about 1 μm), and a Te-doped n-type GaAlAs cladding layer 31 (thickness: 30 μm) were grown successively. In the active layer, the proportions of Ga, Al, and As were regulated to 0.65:0.35:1, so as to attain an emission wavelength of 660 nm. In the p-type transparent substrate, and the p-type and n-type cladding layers, the proportions of Ga, Al, and As were regulated to 0.35:0.65:1, so as to transmit light of 660 nm. Subsequently, the GaAs substrate was removed through etching, to thereby form the epitaxial wafer in which light was not absorbed by the substrate. Therefore, light is emitted from the entirety of the semiconductor light-emitting device exclusive of an electrode portion.

An ohmic electrode 27 provided on the p-type substrate was formed from an AuBe alloy, and an ohmic electrode 33 provided on the n-type cladding layer was formed from an AuGeNi alloy. The electrode 27 was formed so as to cover the entirety of the GaAlAs transparent substrate layer. An opening of 150 μmφ was formed in the electrode 33 provided on the n-type cladding layer. The opening served as a window for light extraction (light extraction sectoin 34). The resultant wafer was applied onto a vinyl-chloride-made adhesive sheet containing an acrylic adhesive layer. Subsequently, the wafer was separated by use of a dicing saw into individual semiconductor light-emitting devices so as to form a square shape and have a pitch of 400 μm. While being heated, the sheet was expanded by use of an expander such that regular intervals were provided between the devices.

Thereafter, a solution containing Al foil chips in an amount of about 50% and a resin in an amount of 50%, which solution was diluted to ⅕ with a solvent, was applied to the spaces between the devices. The Al foil chip had a thickness of 0.02 μm and an average size of 10 μm, the size falling within a range of about 1–30 μm. The resultant wafer was subjected to heat treatment at 30° C. for 360 minutes so as to evaporate the solvent, to thereby form a light-shielding film 32 (i.e., a light reflection film) on the side surfaces of the device. The amount of the solution for application was determined so as to attain a film thickness of about 10 μm during application. After drying, the thickness of the film was about 2 μm.

In the light-shielding film, the Al foil chips were arranged horizontally such that each chip adhered to the surface of the device. Similarly to the case of Example 11, the total reflectivity of the film was 90%, and the regular reflectivity was 80%. The resultant semiconductor light-emitting device was mounted on a flat TO-18 stem containing no light reflection cup, and the emission directivity of the device was measured through application of a current of 20 mA (DC). Consequently, the semiconductor light-emitting device exhibited ideal emission directivity; i.e., light is emitted only through the light extraction section. The evaluation results are shown in Table 1. The device was subjected to measurement of total luminous energy by use of an integrating-sphere photometer, and the emission output of the device was found to be 2.1 mW.

Comparative Example 3

Figure 6:
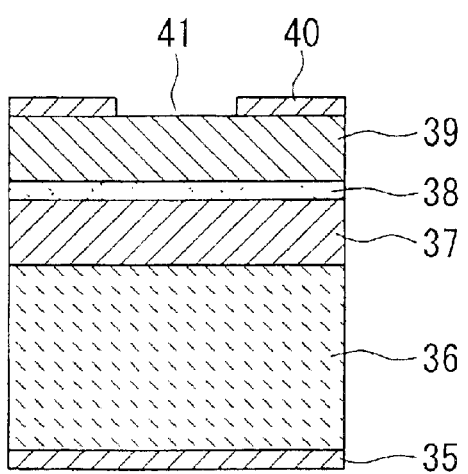
FIG. 6 is a cross-sectional view of the semiconductor light-emitting device of Comparative Example 3.

FIG. 6 shows a cross-sectional view of the semiconductor light-emitting device produced in Comparative Example 3. In this figure, reference numeral 35 indicates AuBe alloy electrode, reference numeral 36 indicates p-type transparent substrate layer, reference numeral 37 indicates p-type GaAlAs cladding layer, reference numeral 38 indicates GaAlAs active layer, reference numeral 39 indicates n-type GaAlAs cladding layer, reference numeral 40 indicates AuGeNi alloy electrode, and reference numeral 41 indicates light extraction section. A light reflection film was not formed on the wafer prepared in Example 12, and the resultant semiconductor light-emitting device was subjected to characteristic evaluation. The emission directivity of the device was measured in a manner similar to that of Example 12. Consequently, the emission directivity of the device was poor, because of leakage of light from the side surfaces of the device. The device was subjected to measurement of total luminous energy by use of an integrating-sphere photometer, and the emission output of the device was found to be 2.6 mW. The evaluation results are shown in Table 1. The device of Comparative Example 3 was poor in emission directivity as compared with the devices of Example 11 and 12; i.e., utility of the present invention was verified.

Example 13

A high-output semiconductor red-light-emitting device containing no substrate was used for producing an optical sensor apparatus.

In Example 13, the semiconductor light-emitting device of Example 12 was used. The light extraction section of the device was subjected to masking by use of a resist resin in advance. The device was mounted on a lead frame by use of an Ag paste, and mounted in a chip-type semiconductor light-emitting device. A light reflection plate and a light refection cup were not formed on the chip-type semiconductor light-emitting device, and a flat lead frame was employed. The other electrode was connected to the device through a wire bonding method.

Thereafter, a solution containing Al foil chips in an amount of about 50% and a resin in an amount of 50%, which solution was diluted to ⅕ with a solvent, was applied to the surface of the device through spraying, to thereby form a light reflection film having a regular thickness on the device. The Al foil chip had a thickness of 0.02 μm and an average size of 10 μm, the size falling within a range of about 1–30 μm. The lead frame was subjected to heat treatment at 50° C. for 60 minutes so as to evaporate the solvent, to thereby form a light reflection film on the surface of the device. The amount of the solution for application was determined so as to attain a film thickness of about 20 μm during application. After drying, the thickness of the film was about 3 μm. Thereafter, the masking rein applied onto the light extraction window was removed, the light reflection substance was removed from the light extraction section, and the device was encapsulated with an epoxy resin.

In the light reflection film, the Al foil chips were arranged horizontally such that each chip adhered to the surface of the device. Similarly to the cases of Examples 11 and 12, the total reflectivity of the film was 90%, and the regular reflectivity was 80%. The emission directivity of the chip-type semiconductor light-emitting device was measured through application of a current of 20 mA (DC). Consequently, the semiconductor light-emitting device exhibited ideal emission directivity; i.e., light is emitted only through the light extraction section. The evaluation results are shown in Table 1. The device was subjected to measurement of total luminous energy by use of an integrating-sphere photometer, and the emission output of the device was found to be 4.5 mW.

Comparative Example 4

A chip-type semiconductor light-emitting device was produced by use of the device of Example 13 without formation of a light reflection film. The resultant semiconductor light-emitting device was subjected to characteristic evaluation. The emission directivity of the device was measured in a manner similar to that of Example 13. Consequently, the emission directivity of the device was poor, because of leakage of light from the side surfaces of the device. The device was subjected to measurement of total luminous energy by use of an integrating-sphere photometer, and the emission output of the device was found to be 5.1 mW. The device of Comparative Example 4 was poor in emission directivity as compared with the devices of Example 11, 12, and 13; i.e., utility of the present invention was verified. The evaluation results are shown in Table 1.

Comparative Example 5

A light reflection film was not formed on the device of Example 13. The device was mounted on a lead frame containing a light reflection plate, and subjected to characteristic evaluation in a manner similar to that of Comparative Example 4. The evaluation results are shown in Table 1. The emission directivity of the device was improved as compared with the device of Comparative Example 4, but the degree of light collection at the front was poor as compared with the case of Example 13. The device was subjected to measurement of total luminous energy by use of an integrating-sphere photometer, and the emission output of the device was found to be 5.0 mW. The device of Comparative Example 5 was poor in emission directivity as compared with the devices of Example 11, 12, and 13; i.e., utility of the present invention was verified.

INDUSTRIAL APPLICABILITY

According to the present invention, a small-sized semiconductor light-emitting device exhibiting high emission directivity and having high output can be produced.

The semiconductor light-emitting device of the present invention can be conveniently produced by means of the production process of the present invention.

The semiconductor light-emitting device of the present invention can be used as a light source of high emission directivity and high emission intensity, and thus optical communication of long distance, high rate, and high sensitivity can be carried out by use of the device. In addition, an optical communication apparatus, an electronic apparatus, or an optical sensor featuring high functionality, high performance, small size, power savings, and low cost can be provided when the device is used in the apparatus or the sensor.

What is claimed is:

1. A semiconductor light-emitting device comprising a pn-junction portion covered with a light-shielding substance,
   wherein the light-shielding substance comprises powder on the surface of which an electrically insulating layer is formed, and the light-shielding substance has an electrical resistance of at least $10^6$ Ωm.

2. A semiconductor light-emitting device according to claim 1, wherein the light-shielding substance comprises at least one species selected from among metals and pigments.

3. A semiconductor light-emitting device according to claim 2, wherein the metal comprises at least one species selected from among Al, Cu, Ag, Au, Pt, Ti, Ni, Sn, Pb, Mg, Zn, Fe, Co, and Cr.

4. A semiconductor light-emitting device according to claim 2, wherein the pigment comprises at least one species selected from among organic and inorganic pigments, such as extender pigments, white pigments, black pigments, yellow pigments, brown pigments, red pigments, purple pigments, blue pigments, green pigments, fluorescent pigments, and metallic powder pigments.

5. A semiconductor light-emitting device according to claim 2, wherein the light-shielding substance comprises powder, and the surface of the powder is covered with a resin having a thickness falling within a range of approximately 0.01–30 μm.

6. A semiconductor light-emitting device according to claim 2, wherein the particle size of the powder falls within a range of approximately 0.01–100 μm.

7. A semiconductor light-emitting device according to claim 2, wherein the powder is a plate-like powder having a thickness falling within a range of approximately 0.001–10 μm and a length falling within a range of approximately 0.01–100 μm.

8. A semiconductor light-emitting device according to claim 1, wherein the light-shielding substance comprises a substance having a total reflectivity of 50% or more in an amount of 50 mass % or more.

9. A semiconductor light-emitting device according to claim 1, wherein the wavelength of emission of the device falls within the range of approximately 350–1,800 nm.

10. A semiconductor light-emitting device according to claim 1, wherein the light-shielding substance which covers a portion of the device has a transmittance of 50% or less with respect to the light emitted by the device.

11. A semiconductor light-emitting device according to claim 1, wherein the surface of a portion of the device which is covered with the light-shielding substance has an irregular portion.

12. A semiconductor light-emitting device according to claim 11, wherein the depth of the irregular portion fails within a range of approximately 0.1–50 μm.

13. A resin-encapsulated light-emitting device which is produced from a semiconductor light-emitting device as recited in claim 1.

14. A resin-encapsulated light-emitting device according to claim 13, wherein a resin used for encapsulation transmits light emitted from a semiconductor light-emitting device, and comprises any single species selected from among epoxy resins, urea resins, and silicone resins.

15. An optical sensor which is produced from a semiconductor light-emitting device as recited in claim 1, or a resin-encapsulated light-emitting device as recited in claim 13.

16. An optical communication apparatus or a display apparatus which is produced from a semiconductor light-emitting device as recited in claim 1, or from a resin-encapsulated light-emitting device as recited in claim 13.

* * * * *